(12) United States Patent
Kuhn

(10) Patent No.: US 11,029,362 B2
(45) Date of Patent: Jun. 8, 2021

(54) NON-CONTACT VOLTAGE DETECTOR

(71) Applicant: Klein Tools, Inc., Lincolnshire, IL (US)

(72) Inventor: Bruce Kuhn, Naperville, IL (US)

(73) Assignee: Klein Tools, Inc., Lincolnshire, IL (US)

(*) Notice: Subject to any disclaimer, the term of this patent is extended or adjusted under 35 U.S.C. 154(b) by 0 days.

(21) Appl. No.: 16/853,816

(22) Filed: Apr. 21, 2020

(65) Prior Publication Data

US 2020/0319255 A1 Oct. 8, 2020

Related U.S. Application Data

(63) Continuation of application No. 16/105,455, filed on Aug. 20, 2018, now Pat. No. 10,663,527, which is a continuation of application No. 15/073,939, filed on Mar. 18, 2016, now Pat. No. 10,073,142.

(60) Provisional application No. 62/136,125, filed on Mar. 20, 2015.

(51) Int. Cl.
*G01R 31/3835* (2019.01)
*G01R 1/067* (2006.01)
*G01R 1/07* (2006.01)
*G01R 19/155* (2006.01)
*G01R 29/08* (2006.01)

(52) U.S. Cl.
CPC ..... *G01R 31/3835* (2019.01); *G01R 1/06788* (2013.01); *G01R 1/07* (2013.01); *G01R 19/155* (2013.01); *G01R 29/0857* (2013.01)

(58) Field of Classification Search
CPC .. G01R 31/3835; G01R 1/06788; G01R 1/07; G01R 29/0857; G01R 19/155
See application file for complete search history.

(56) References Cited

U.S. PATENT DOCUMENTS

2016/0267754 A1* 9/2016 Hickman ............... G01R 1/07

* cited by examiner

*Primary Examiner* — Peggy A Neils

(57) ABSTRACT

A voltage detector includes a cylindrical hollow body housing including an open end and a tool end. An internal circuit assembly includes a voltage sensing loop, a flashlight, and a microprocessor. The internal circuit assembly is disposed inside the cylindrical hollow body housing. The voltage sensing loop is configured to detect voltage without contacting a detected voltage, and the microprocessor is configured to control power to the flashlight via a flashlight power button independently from power to the voltage sensing loop via a voltage detector button.

7 Claims, 6 Drawing Sheets

| | AUTOMATIC POWER OFF RULES FOR THIS STATE | Press Flashlight Button | Press Voltage Detector Button |
|---|---|---|---|
| STATE 1<br>FLASHLIGHT OFF<br>VOLTAGE DETECTOR OFF | NOT APPLICABLE – NOTHING TO POWER OFF | Turns Flashlight ON<br>Enter STATE 3 | Turns Voltage Detector ON<br>Enter STATE 2 |
| STATE 2<br>FLASHLIGHT OFF<br>VOLTAGE DETECTOR ON | VOLTAGE DETECTOR AUTOMATICALLY POWERS OFF IN 4 MINUTES, PUTTING THE DEVICE INTO STATE 1. TIMER RESETS WHEN VOLTAGE IS DETECTED | Turns Flashlight ON<br>Enter STATE 4 | Turns Voltage Detector OFF<br>Enter STATE 1 |
| STATE 3<br>FLASHLIGHT ON<br>VOLTAGE DETECTOR OFF | FLASHLIGHT AUTOMATICALLY POWERS OFF AFTER 20 MINUTES, ENTERING STATE 1. 10 SECOND AUDIBLE WARNING BEFORE POWER OFF ALLOWS USER TO RESET TIMER BY PRESSIN GTHE FLASHLIGHT BUTTON | Turns Flashlight OFF<br>Enter STATE 1 * | Turns Voltage Detector ON<br>Enter STATE 4 |
| STATE 4<br>FLASHLIGHT ON<br>VOLTAGE DETECTOR ON | FLASHLIGHT AUTOMATICALLY POWERS OFF AFTER 20 MINUTES, PUTTING THE DEVICE INTO STATE 1. 10 SECOND WARNING BEFORE POWER OFF ALLOWS USER TO RESET TIMER. TIMER RESETS WHEN VOLTAGE IS DETECTED. 4-MIN. TIMER FOR VOLTAGE DETECTOR IS DISABLED AND VOLTAGE DETECTOR POWERS DOWN WITH FLASHLIGHT BASED ON 20 MIN TIMER | Turns Flashlight OFF<br>Enter STATE 2 | Turns Voltage Detector OFF<br>Enter STATE 3 |

* EXCEPT DURING 10SEC. TIMEOUT WHEN PRESSING ONCE RESETS TIMER PUTTING UNIT IN STATE 3

Fig. 5

NON-CONTACT VOLTAGE DETECTOR

CROSS-REFERENCE TO RELATED APPLICATION

This patent application is a continuation of copending U.S. patent application Ser. No. 15/073,939, filed Mar. 18, 2016, which claims the benefit of U.S. Provisional Patent Application No. 62/136,125, filed Mar. 20, 2015, both of which applications are incorporated herein by reference.

FIELD OF THE DISCLOSURE

The present disclosure relates to non-contact voltage detectors and, more particularly, to non-contact voltage detectors that include a flashlight.

BACKGROUND OF THE DISCLOSURE

Non-contact voltage detectors are well known in the field of electrical work, and are used routinely by electricians, utility workers, homeowners, and others who work near electrical equipment to provide a visual and/or audible indication that an electrical component is energized with electrical voltage. Often, the source of electrical voltage is located in a dark place and difficult to see, such as within a wall, ceiling, or panel box. Thus, it is advantageous for a non-contact voltage detector to include both a means of illuminating the area to be tested and a means to alert the user to the presence of a potentially dangerous voltage.

U.S. Pat. No. 6,924,605 to Chun describes a non-contact voltage detector with a built-in flashlight. The function of the Chun device is typical of current non-contact voltage detector and flashlight devices. When the unit is powered on, both the flashlight and the voltage detector power up, and when the power is turned off, or when the battery gets too weak, both the voltage detector and the flashlight shut down. The device of Chun will remain active until it is turned off, so the operator can rely on its readings during use, which can cause the battery to drain quickly. In the past, attempts have been made to prolong battery life of non-contact voltage detectors, for example, by using automatic power shutoff systems. Such systems, however, can shut-off the detector while the user believes it to be on, which may lead to inaccurate readings.

SUMMARY OF THE DISCLOSURE

The present disclosure is directed to a non-contact voltage detector with an integrated flashlight in which the flashlight and the voltage detector can be powered independently. The detector further includes a microprocessor controlled power-down system, which turns off the flashlight system and the voltage detector independently after predetermined and resettable time periods, and which prevents the voltage detector from powering down while the flashlight is lit.

The device in accordance with the present disclosure addresses many of the issues apparent in the prior art devices. The voltage detector can be powered on independently of the flashlight, which results in a much lower rate of power consumption and preserves battery life. The voltage detector automatically powers down after a predetermined time period, and the time period resets whenever voltage is detected by the tester. The flashlight can also be powered up independently of the voltage detector, and since it will not be on at all times when the voltage detector is in use, a much brighter and more powerful illumination source is used without high battery drain, and will power down automatically after a predetermined time period. A microprocessor controls the power systems and automatic timeouts, and in addition ensures that the voltage detector does not power down while the flashlight is on.

BRIEF DESCRIPTION OF THE DRAWINGS

FIG. 5 is a state diagram of various power states and automatic power down programming for a detector in accordance with the disclosure.

DETAILED DESCRIPTION OF A PREFERRED EMBODIMENT

Figure 1:
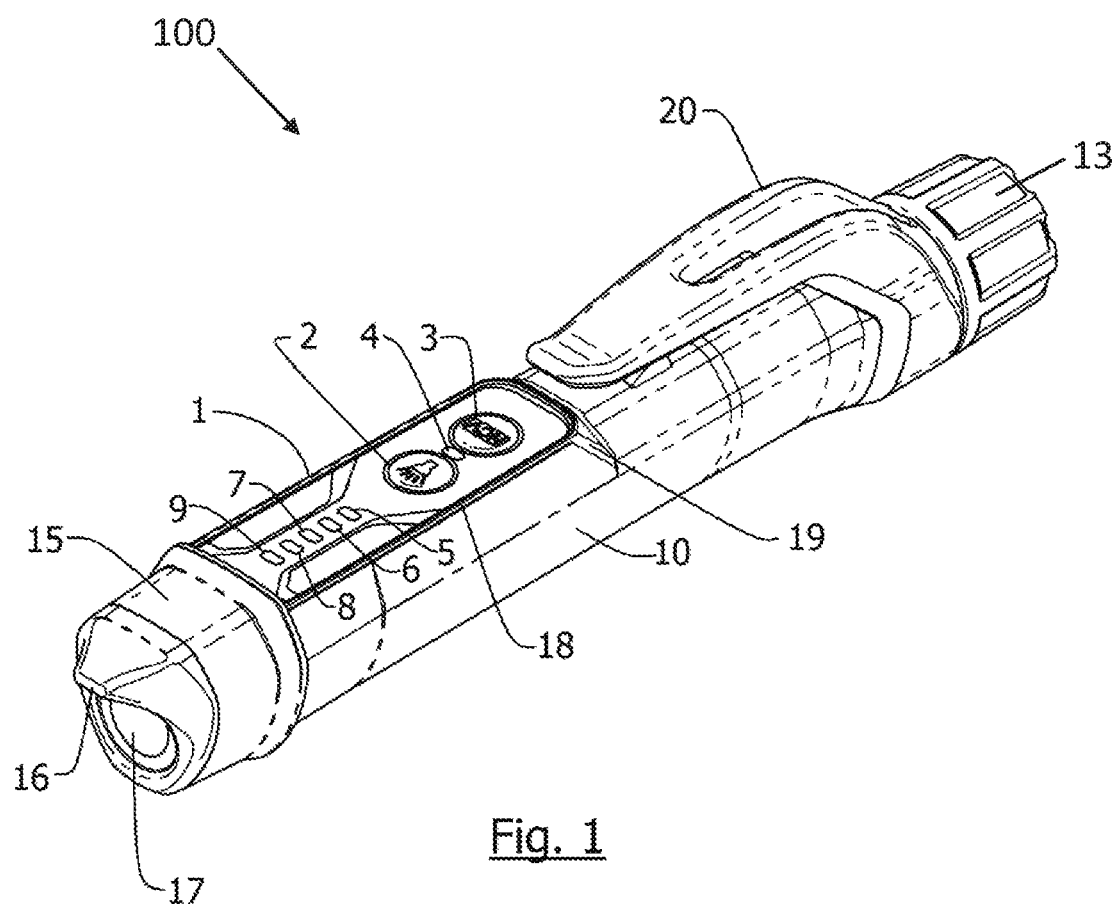
FIG. 1 is a perspective view of a detector in accordance with the disclosure.

A preferred embodiment in accordance with the disclosure is depicted in the accompanying figures. A detector 100 in accordance with the disclosure is shown in FIG. 1 from a perspective view. The detector 100 includes a generally cylindrical hollow body 10 with an open end cap 13 and a tool end cap 15. The tool end cap 15 is generally constructed of translucent plastic and features a sensor protrusion 16 and a transparent flashlight lens 17. On the forward half of the cylindrical hollow body 10 and aligned with the sensor protrusion 16 is a user interface panel 1, which rests on a raised surface 18 supported by extended walls 19 rising out of the cylindrical hollow body 10. Between the cylindrical hollow body 10 and the open end cap 13 is positioned a pocket clip 20 for affixing the device to various surfaces, such as a shirt pocket. During use, the user may grasp the detector 100 from the body 10 and use fingers to operate the controls on the user interface panel 1, as well as receive visual feedback and signals therefrom based on the various illumination devices disposed thereon, as discussed below.

Figure 2:
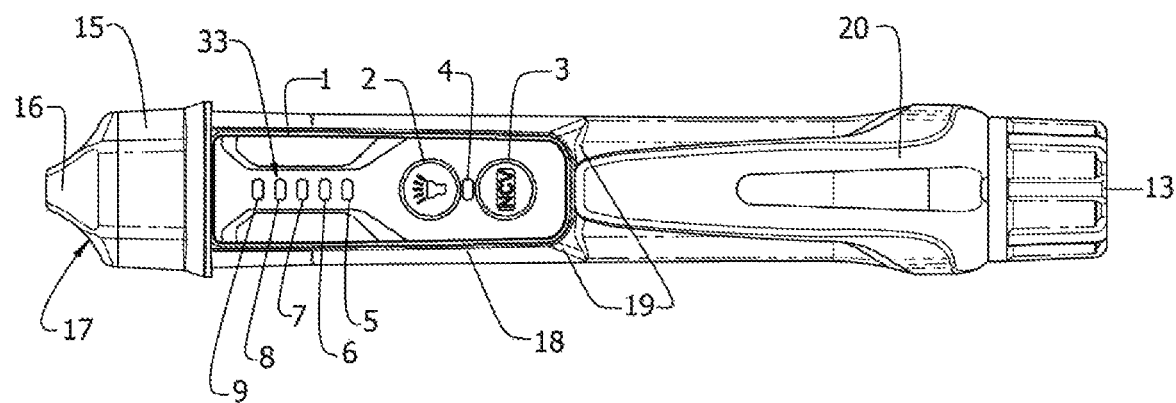
FIG. 2 is a top view of the detector shown in FIG. 1.

FIG. 2 depicts the detector 100 as seen from the top, for example, in the orientation the user is likely to view the detector 100 in use. The user interface panel 1 includes a flashlight power button 2, which is useful to activate or deactivate the flashlight visible through the lens 17, a voltage detector power button 3, which activates and deactivates the voltage detector functionality of the detector 100, a voltage detector power indicator light 4, which provides a visual indication of the power state of the voltage detector structures, and a voltage detector intensity readout 33, which provides a visual indication of the voltage intensity being measured. The voltage detector power indicator light 4, for example, may activate when a voltage is detected. Alternatively, the voltage detector power indicator light 4 may change color when a voltage is detected. In the illustrated embodiment, multiple illumination devices are arranged in a series in the general form of a bar graph such that they can be illuminated in series to provide an indication of intensity. As shown, five indicator light emitting diode (LED) lights: LED1 5, LED2 6, LED3 7, LED4 8 and LED5 9 of the same or different colors may be used. In the illustrated embodiment, LED1 5 and LED2 6 illuminate in yellow and LED3 7, LED4 8 and LED5 9 illuminate in red. The detector 100 may also include a battery indicator that indicates a battery level of the device when the device is activated.

Figure 3:
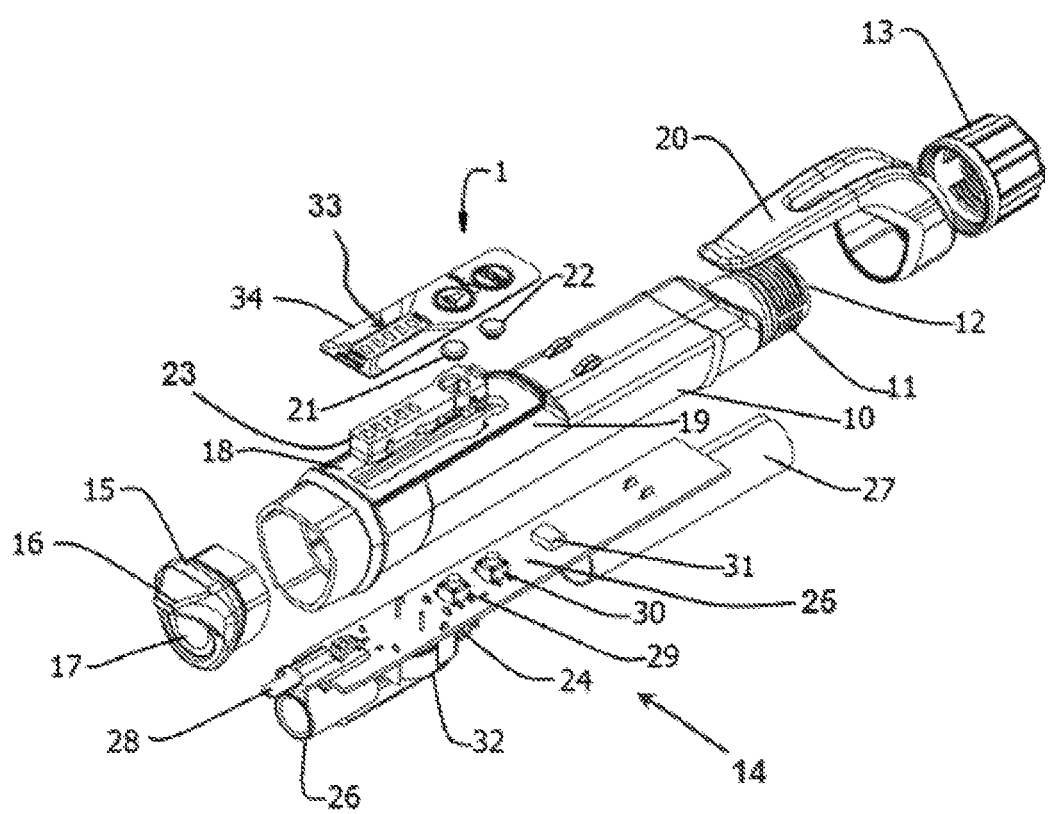
FIG. 3 is an exploded view of the detector shown in FIG. 1.

FIG. 3 depicts the detector 100 in an exploded perspective view. Here, the cylindrical hollow body 10, tool end cab 15, pocket clip 20, and open end cap 13 are shown separated. The open end cap 13 is internally threaded and interfaces with a male thread 11 on the open end 12 of the cylindrical hollow body 10. The functional parts of the user interface panel 1 include a cover panel 34, a flashlight power soft touch button 21, which can be used to power the flashlight functionality on and off, a voltage detector soft touch button 22 and a LED lens assembly 23. The LED lens assembly 23 channels indication lighting from the main circuit board 25 to the voltage detector intensity readout 33. The internal circuit assembly 14, which would ordinarily reside inside the cylindrical hollow body 10, is instead shown beside the body 10.

The internal circuit assembly 14 is composed of a main circuit board 25, a flashlight 26, a battery holding sleeve 27, with associated battery contacts 24, and a voltage sensing loop 28. The battery holding sleeve 27 in the detector 100 is adapted to hold two AAA batteries, with electrical connections at the battery contacts 24 and in the open end cap 13, but a different number and/or type of batteries can be used. Among other components, the main circuit board 25 includes a flashlight switch 29, a voltage detector switch 30 and a microprocessor 31. A voltage detection speaker 32 is located on the underside of the board and is used to provide an audible indication of the detection of voltage. A volume and/or speed of succession of beeping sounds can also be used to audibly alert the user of the presence and intensity of a voltage detected.

Figure 4:
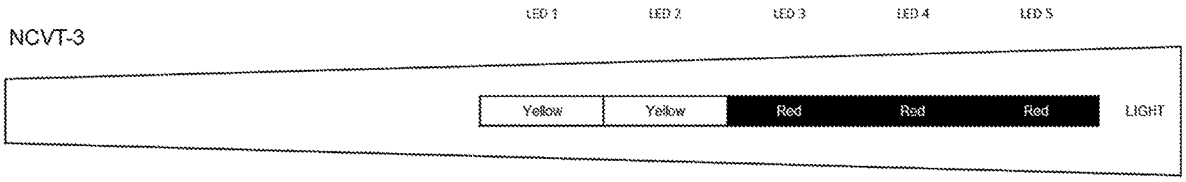
FIG. 4 is a state diagram of various functions of a detector in accordance with the disclosure.

FIG. 4 depicts the functional programming of the microprocessor 31 as it pertains to voltage detection. In the illustrated embodiment, detection is segregated into six discrete Bands, but other bands or segregation schemes may be used. In the description that follows, the particular voltage values discussed are exemplary and should not be construed as limiting to the scope of the disclosure. In the illustrated embodiment, Band 1, indicates a condition where no voltage is detected and the device returns no audible or visual responses. As the detected voltage at the voltage sensing antenna or loop 28 approaches 9V, LED 1 5 begins to flicker on and off.

In Band 2, a condition is indicated where a relatively low voltage is detected and the device returns a, relatively slow, repeating audible cue and illuminates a single light, LED 1. In Band 2, where the detected voltage at the voltage sensing loop 28 exceeds 9V but is equal to or less than 18V, LED1 5 is illuminated in yellow and the voltage detection speaker 32 emits an audible beep that is pulsed at a frequency of 1 Hz. As the detected voltage at the voltage sensing loop 28 approaches 19V, LED 2 6 begins to flicker on and off.

In Band 3, a condition is indicated where a relatively higher voltage than the voltage detected in Bad 2 has been detected, and repeating audible cue is accelerated and more LEDs are illuminated. In the illustrated embodiment, in Band 3, where the detected voltage at the voltage sensing loop 28 exceeds 19V but is equal to or less than 48V, LED1 5 and LED2 6 are illuminated in yellow and the voltage detection speaker 32 emits an audible beep that is pulsed at a frequency of 2 Hz. As the detected voltage at the voltage sensing loop 28 approaches 49V, LED 3 7 begins to flicker on and off. It is noted that LEDs 1 and 2 are yellow, but LED 3 is red, to indicate the higher voltage by color in addition to the greater number of illuminated indicators.

In Band 4, which indicates a higher voltage condition than in Band 3, the detected voltage at the voltage sensing loop 28 exceeds 49V but is equal to or less than 85V, LED1 5 and LED2 6 are illuminated in yellow and LED3 7 is illuminated in red and the voltage detection speaker 32 emits a steady beep, but a higher or different frequency can be used. As the detected voltage at the voltage sensing loop 28 approaches 86V, LED 4 8 begins to flicker on and off.

In Band 5, which indicates a higher voltage condition than in Band 4, the detected voltage at the voltage sensing loop 28 exceeds 85V but is equal to or less than 175V, LED1 5 and LED2 6 are illuminated in yellow and LED3 7 and LED4 8 are illuminated in red and the voltage detection speaker 32 emits a steady audible beep, but a pulsed beep at any frequency higher than a lower bank may be used. As the detected voltage at the voltage sensing loop 28 approaches 176V, LED 5 9 begins to flicker on and off.

In Band 6, the highest voltage detection condition, where the detected voltage at the voltage sensing loop 28 exceeds 175V, LED1 5 and LED2 6 are illuminated in yellow and LED3 7, LED4 8, and LED5 9 are illuminated in red and the voltage detection speaker 32 emits a steady beep.

FIG. 5 depicts one embodiment of a functional programming of the microprocessor 31 as it pertains to the automatic shutdown features of the detector 100 shown in FIG. 1. The power programming and automatic shutdown is separated into four power states or conditions for the detector 100, which are denoted as State 1, State 2, State 3 and State 4, but more or fewer conditions may be used.

In State 1, defined by the flashlight 26 and the voltage sensing loop 28 both being in an unpowered state, the microprocessor 31 is also powered down and no action occurs. In this condition, power drain from the battery of the detector 100 is minimal or zero. Pushing the flashlight power button 2 from State 1 puts the device into state 3. Pushing the voltage detector button 3 from State 1 puts the device into State 2. In a preferred embodiment, the voltage intensity readout 33 briefly displays an indication of the remaining battery strength when entering State 2.

In State 2, defined by the flashlight 26 being powered off and the voltage sensing loop 28 being powered on, the microprocessor 31 is programmed to automatically power the device down after 4 minutes, putting the device into State 1. The 4 minute power down timer is reset every time the device detects a voltage, activating the voltage detector intensity readout 33 and the voltage detection speaker 32. It should be appreciated that in this state, power consumption will be low because the flashlight is not activated. Pushing the flashlight power button 2 from State 2 puts the device into State 4. Pushing the voltage detector button 3 from State 2 puts the device into State 1.

In State 3, defined by the flashlight 26 being powered on and the voltage sensing loop 28 being powered off, the microprocessor 31 is programmed to automatically power the flashlight down after 20 minutes, putting the device into State 1. In this state, the power draw from the battery is relatively low because the voltage sensing apparatus is not powered. Ten seconds prior to powering down the flashlight 26, the voltage detection speaker 32 issues an audible alert, allowing the user to reset the tool in State 3 by pushing the flashlight power button 2. Pushing the flashlight power button 2 from State 3 puts the device into State 1. Pushing the voltage detector button 3 from State 3 puts the device into State 4.

In State 4, defined by the flashlight 26 being powered on and the voltage sensing loop 28 being powered on, the microprocessor 31 is programmed to automatically power the flashlight down after 20 minutes, putting the device into State 2. In this state, the 4-minute power down timer for the voltage sensing loop is disabled, and now controlled by the 20-minute flashlight power down timer. The 20-minute power down timer is reset every time the device detects a voltage, activating the voltage detector intensity readout 33 and the voltage detection speaker 32. In this state, the power draw from the battery is maximum because both the flashlight and the voltage detector circuit are active.

Ten seconds prior to powering down the flashlight 26, the voltage detection speaker 32 issues an audible alert and the microprocessor 31 alters the function of the flashlight power button 2, allowing the user to reset the tool in State 4 by pushing the flashlight power button 2. Pushing the flashlight power button 2 from State 4 puts the device into State 2. Pushing the voltage detector button 3 from State 3 puts the device into State 3. If no buttons are pushed, the device times out after 20 minutes and powers down the flashlight and voltage detector, thus entering into state 1.

Figure 6:
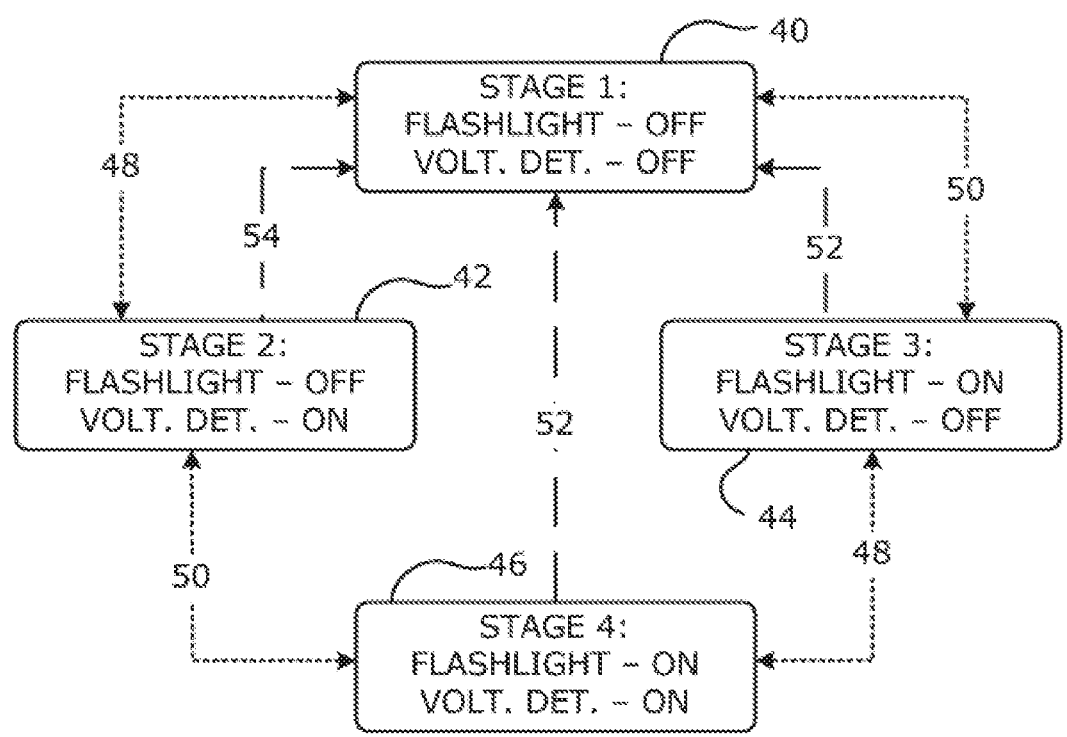
FIG. 6 is a flow diagram of the various power states for a detector in accordance with the disclosure.

A state flow diagram illustrating the various operating stages of the detector 100 (FIG. 1) are shown in FIG. 6. The detector may operate at a first stage 40, where the flashlight and the voltage detector circuit are both in an unpowered state. The first stage 40 is also the default stage the detector will assume regardless of its powered state if left alone without user input for a preset period, as described above and also below. From the first stage 40, the detector will enter into a second stage 42 by user action, for example, when a voltage detector power button is pressed at 48. An additional press of the voltage detector power button at the second stage will return the detector to the first stage, again, via 48. In other words, successive presses of the voltage detector power button will toggle the power stage of the detector between the first stage 40 and the second stage 42. Each time the detector enters the second stage 42, a timer starts, for example, a 4 minute timer, that counts down to an automatic power off of the detector circuit. If the timer expires, with no user input and no voltage detection, the detector will power off the voltage detector circuit and revert to the first power stage 40.

Similarly, and independently, from the first stage 40, the detector will enter into a third stage 44 by user action, for example, when a flashlight power button is pressed at 50. An additional press of the flashlight power button at the third stage 44 will return the detector to the first stage, again, via 50. In other words, successive presses of the flashlight power button will toggle the power stage of the detector between the first stage 40 and the third stage 44. Each time the detector enters the third stage 44, an additional timer will start, for example, a 20 minute timer, that counts down to an automatic power off of the flashlight. If the additional timer expires, with no user input, the detector will power off the flashlight and revert to the first power stage 40 via 52.

The detector can also assume a fourth stage 46 of power operation. At the fourth stage 46, both the flashlight and the voltage detector circuit are active. To arrive at the fourth stage 46, from the first stage 40, the detector may either pass through the second stage 42 via 48, and then continue onto the fourth stage via 50 or, alternatively, pass through the third stage 44 via 50, and then continue onto the fourth stage via 48, depending on the sequence of activation of the flashlight and the voltage detection circuit by the user. When in the fourth stage 46, the detector can enter into the second stage 42 via 50, or the third stage 44 via 48, depending on user input, i.e., if the user presses either flashlight power button (50) or the voltage detector circuit power button (48). Each time the detector enters the fourth stage 46, the additional timer will start, for example, a 20 minute timer, that counts down to an automatic power off of the flashlight and, in this stage only, the voltage detector circuit, whose 4-minute timer as described in stage 2 is superseded. If the additional timer expires, with no user input, the detector will power off the flashlight, and also the voltage detector circuit, and revert from the fourth stage 46 to the first stage 40 via 52. In an alternative embodiment, a separate timer may initiate after the additional timer, which powers down the flashlight, expires. The separate time, which can be a 4-minute timer, can extend the powered state of the voltage detection circuits beyond the power off time of the flashlight, such that voltage can be detected for a longer period. In such alternative embodiment, the device may transition from stage 4 to stage 2 and then, ultimately if there is no user input, to stage 1. To conserve power, when the microprocessor detects a low battery level, the voltage detector may be configured to enter stage 2 but not stage 3 or stage 4.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values, or values, herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

I claim:

1. A control system for a voltage detector having a voltage detector circuit and a flashlight circuit comprising:
   a first stage, the first stage corresponding with a deactivated voltage detector circuit and a deactivated flashlight circuit;
   a second stage, the second stage corresponding with an activated voltage detector circuit and a deactivated flashlight circuit;
   a third stage, the third stage corresponding with a deactivated voltage detector circuit and an activated flashlight circuit; and
   a fourth stage, the fourth stage corresponding with an activated voltage detector circuit and an activated flashlight circuit,
   wherein the first stage is a default stage, and
   wherein:
   user action is required to transition from the first stage to any one of the second stage, the third stage, and the fourth stage, and
   user action is required to transition from the second stage to the fourth stage.

2. The control system of claim 1, wherein the voltage detector automatically enters the first stage from the second stage after a first predetermined period of time, and
   wherein the voltage detector automatically enters the first stage from the third stage after a second predetermined period of time, the voltage detector issuing an audible alert via a voltage detection speaker before the second predetermined period of time expires.

3. The control system of claim 2, wherein the voltage detector automatically enters the first stage from the fourth stage after the second predetermined period of time expires.

4. The control system of claim 2, wherein the second predetermined period of time is greater than the first predetermined period of time.

5. The control system of claim 1, wherein a timer starts when the voltage detector enters at least one of the second stage, the third stage, and the fourth stage.

6. The control system of claim 5, wherein if the voltage detector is in at least one of the second stage and the fourth stage, the timer resets when a voltage is detected.

7. The control system of claim 1, wherein when the microprocessor detects a low battery level, the voltage detector is able to enter the second stage but prevented from entering the third stage or the fourth stage.

* * * * *